United States Patent [19]
Schiemann et al.

[11] 3,974,440
[45] Aug. 10, 1976

[54] MEASURING TRANSFORMER FOR A FULLY INSULATED, METAL-CLAD HIGH-VOLTAGE INSTALLATION

[75] Inventors: Heinz Schiemann; Albert Herrmann; Gerhard Kleen, all of Berlin, Germany

[73] Assignee: Siemens Aktiengesellschaft, Munich, Germany

[22] Filed: May 17, 1974

[21] Appl. No.: 471,013

[30] Foreign Application Priority Data
May 17, 1973   Germany............................ 2325444

[52] U.S. Cl. ............................ 323/44 R; 174/99 R; 174/DIG. 10; 307/147; 323/93
[51] Int. Cl.² .................... H01F 27/00; H01B 9/06
[58] Field of Search ............. 307/147, 149; 323/93, 323/44 R, 60, 61; 174/27, 28, DIG. 10, 99 R, 99 B, 13

[56] References Cited
UNITED STATES PATENTS

| | | | |
|---|---|---|---|
| 1,873,977 | 8/1932 | Naef | 174/DIG. 10 |
| 3,585,270 | 6/1971 | Trump | 174/28 |
| 3,621,109 | 11/1971 | Nakata | 174/28 |
| 3,701,944 | 10/1972 | Amalric | 174/11 BH |
| 3,763,378 | 10/1973 | Muller | 323/93 |
| 3,829,742 | 8/1974 | Muller | 323/93 |

*Primary Examiner*—Gerald Goldberg
*Attorney, Agent, or Firm*—Kenyon & Kenyon Reilly Carr & Chapin

[57] ABSTRACT

A measuring transformer for a fully-insulated, metal-clad, high-voltage installation equipped with a metal outer tube containing a high-voltage conductor includes a tube member arranged within the metal outer tube in surrounding relation to the high-voltage conductor. The tube member constitutes a surface-type electrode an conjointly defines with the high-voltage conductor a high-voltage capacitor. A low-voltage capacitor is connected to the high-voltage capacitor so as to conjointly define therewith a capacitive voltage divider. A transformer core unit including an iron core and a transformer winding system mounted on the iron core is also provided. The transformer core unit is arranged on the outer surface of the tube member whereby the tube member carries the transformer core unit inside the metal outer tube of the high-voltage installation.

17 Claims, 2 Drawing Figures

MEASURING TRANSFORMER FOR A FULLY INSULATED, METAL-CLAD HIGH-VOLTAGE INSTALLATION

BACKGROUND OF THE INVENTION

The invention relates to a measuring transformer for completely insulated, metal-clad, high-voltage installations. The transformer includes a tube member arranged inside the metal outer tube of the high-voltage installation. The tube member forms a surface-type electrode and conjointly defines with the high-voltage conductor of the installation a high-potential capacitor of a capacitive voltage divider which includes a low-potential capacitor connected to the high-potential capacitor.

A measuring transformer of this type is described in U.S. Pat. No. 3,763,378. The measuring transformer of this reference can be configured as a combined current and voltage transformer by forming the surface-type electrode by a conductive layer applied to the inner surface of a current transformer casing which is arranged inside the outer tube of the high-voltage installation. The casing houses at least one current transformer core with a secondary coil system mounted thereon.

SUMMARY OF THE INVENTION

It is an object of the invention to provide an improved measuring transformer of the kind described above.

It is another object of the invention to provide a measuring transformer wherein the transformer core unit thereof is unaffected by pressures of a casing which could have an undesirable effect on the current transformer ratio.

Thus, in the measuring transformer according to the invention, the one or more iron cores with the secondary coil system mounted thereon are not subjected to mechanical stress caused by the shrinkage pressure of a casing which is usually made of casting resin; this shrinkage pressure can lead to a subsequent change in the transmission characteristics of the current transformer.

The above objects are realized in the measuring transformer according to the invention which includes as a feature a tube member upon which is mounted at least one transformer core unit at the outer surface of the tube which faces away from the high-voltage conductor. The transformer core unit includes an iron core with a secondary coil system mounted thereon.

The primary advantage of the measuring transformer according to the invention is that mechanical stresses on the cores caused by shrinkage pressure are eliminated by avoiding a casing, usually made of casting resin, for the iron cores and the secondary coils; therefore, permeability changes and hence current error changes caused by shrinkage pressure can therefore not develop. A further advantage of the measuring transformer of the invention lies in the fact that because of the way of mounting the iron cores on the tube member, a subsequent adjustment of the windings is possible during the installation since the windings are also accessible in a completely installed condition.

For the measuring transformer according to the invention, special significance is attached to the shaping of the tube member, even more so, to its mounting within the metal outer tube of the high-voltage installation because the tube member and the high-voltage line conjointly define the high-potential capacitor. The capacity of the high-potential capacitor is therefore largely dependent on the position of the tube member with respect to the high-voltage line, wherefore it will be necessary, in order to obtain a predetermined capacity for the high-potential capacitor, to exactly center the tube member with respect to the high-voltage line.

It therefore appears to be of advantage for the measuring transformer of the invention, to fasten the tube member on one of its ends by means of at least one connecting piece made of insulating material to the outside tube of the high-voltage installation and, to attach to its other end at least one support element of insulating material which can rest against the outer tube. This mounting arrangement of the tube member has the advantage of not causing a lateral enlargement on the high-voltage installation; furthermore, assurance is given that during temperature changes the tube member can vary its length in the direction of the high-voltage conductor thus avoiding buckling of the tube member such as could set in if both ends of the tube member were clamped. Capacity variations of the high-potential capacitor caused by expansions of the tube member resulting from temperature changes are therefore precluded. To obtain the most stable support possible for the tube member, preferably three connecting members and three support elements are distributed with equi-distant spacing over the circumference of the tube member; or, in lieu thereof, a disk-shaped connecting member and supporting element can be provided.

In order to simplify as much as possible the installation of the measuring transformer according to the invention, the tube member has at one of its ends at least one mounting shoulder to which by means of screws the connecting members are fastened; furthermore, by way of additional screws, the connecting members are fastened to a fastening projection of the outer tube of the high-voltage installation. The tube member has at its other end at least one further fastening shoulder to which the support elements are fastened by means of additional screws. The mounting shoulders can be shaped differently. For example, they can be formed by a circular rim. It is however, likewise possible to configure each fastening shoulder as individual shoulders placed equally over the circumference whereby the shoulders are, of course, arranged in such a manner that they face the mounting projections of the outer tube of the high-voltage installation.

In order to facilitate as much as possible the centering of the outer tube in relation to the high-voltage conductor, the holes containing screws in the one fastening shoulder, or the additional holes holding additional screws in the fastening projection as well as the supplementary holes holding supplementary screws each have a larger diameter than the screw shanks. This permits, after the tube member is partially installed, easy movement of the tube member in the radial direction, so that during installation by way of a centering piece pushed over the high-voltage conductor, the tube member can easily be placed into a centered position. In this centered position, in an advantageous manner, common holes are made through the fastening shoulder and the connecting members as well as through the latter and the fastening projection. Additional holes are made through the support elements and the other fastening shoulder. Dowel pins are inserted in these common holes. The tube member is thereby locked to its centered position and can be solidly clamped through tightening of the screws.

In particular when, as is usually required, the tube member has on both of its ends tube pieces forming guard ring electrodes which are insulated from the tube member, a mounting of the tube member in the high-voltage installation is advantageous where the holes containing screws in the one fastening shoulder, or the further holes holding further screws in the fastening projection as well as the additional holes holding additional screws in a fastening tab on one tube piece have a larger diameter than the screws, thereby permitting centering of the tube member in relation to the high-voltage conductor; by way of common holes and pins, as already described, the tube member can then be held in its centered position. Deviating from the foregoing the mounting of the tube member can also be accomplished by means of connecting members and support elements directly connected with tube members on both ends of the tube member.

It can thus be of advantage, if both tube pieces have fastening tabs. The fastening tab on one tube piece is clamped through an inserted spacing piece of insulating material, by means of screws with the fastening shoulder and the connecting member. The fastening tab on the other tube piece is bolted in a corresponding manner to the further fastening shoulder and the support element. In an advantageous way, insulation between the tube pieces and the cylinder can also be achieved by arranging between the fastening tabs and the fastening shoulders at the ends of the tube member the connecting pieces and/or the support elements made of insulating material. Here, the screws which clamp the fastening tabs to the fastening shoulders are advantageously insulated through ring-shaped spacing pieces against the respective fastening tabs or the fastening shoulders.

The tube member is held in the above-described manner inside the outer tube of the high-voltage installation in a centered and stable position. A transformer core unit having an iron core with a secondary coil system mounted thereon can be attached in various ways. For example, one can affix to the iron core a fastening element by means of which the iron core is attached to the tube member. When the holding piece is made of metal it can be welded to the tube member, this being an expeditious manufacturing step. It is also advantageous to mount one or more transformer core units by means of a clamping device. With the clamping device one or more iron cores of the transformer core units can be clamped between the fastening shoulders of the tube member. The fastening shoulders which are used for the mounting of the tube members in the high-voltage installation can thus be used at the same time as a mounting support for the iron core. The clamping device can be made in different ways; advantageously, it consists of pressure screws.

Although the invention is illustrated and described herein as a measuring transformer for a fully-insulated, metal-clad, high-voltage installation, it is nevertheless not intended to be limited to the details shown, since various modifications may be made therein within the scope and the range of the claims. The invention, however, together with additional objects and advantages will be best understood from the following description and in connection with the accompanying drawings.

DESCRIPTION OF THE PREFERRED EMBODIMENTS OF THE INVENTION

Figure 1:
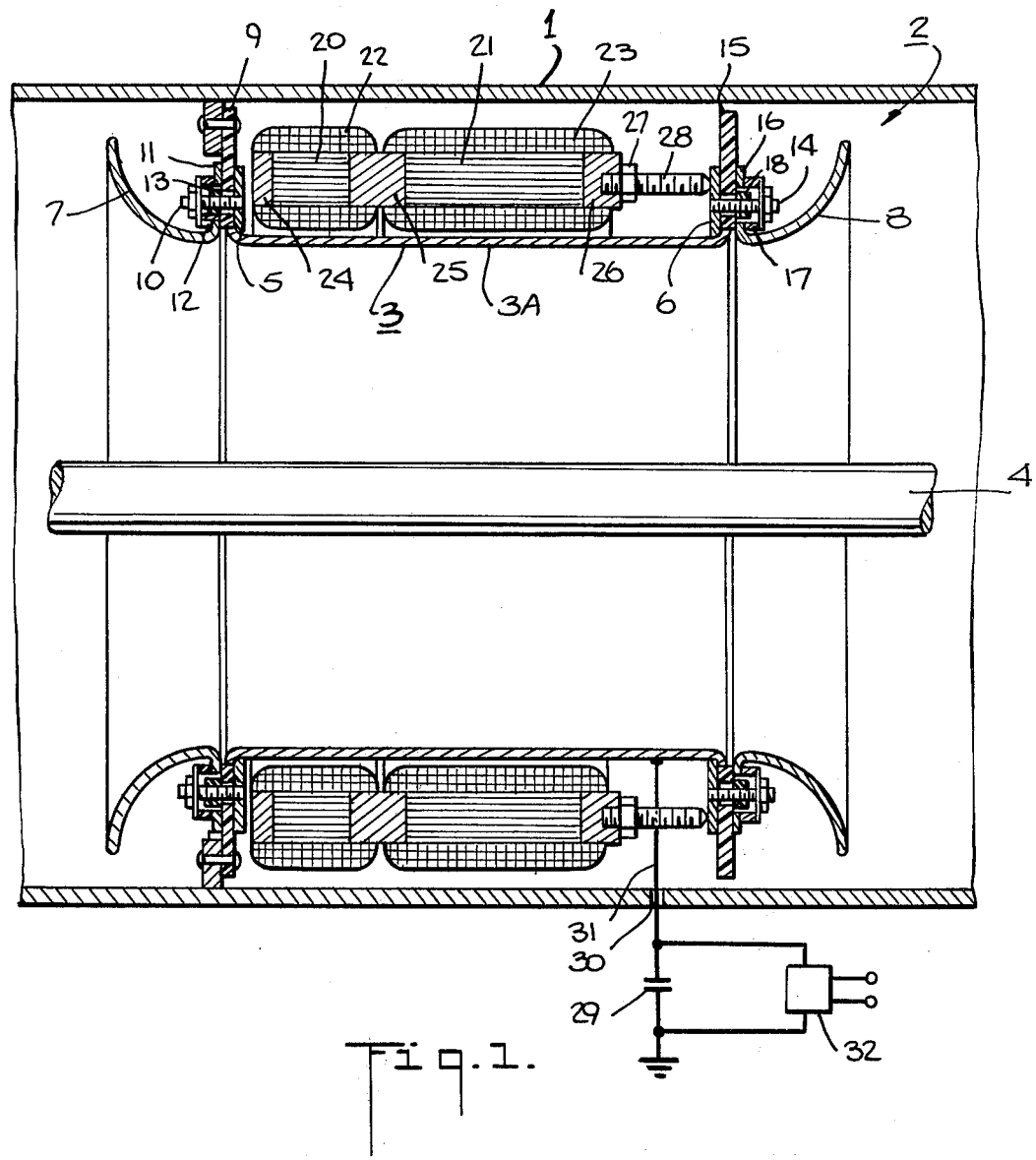
FIG. 1 is a schematic diagram, partially in section, illustrating the measuring transformer according to the invention.

Referring to FIG. 1, a tube member 3 is disposed in spaced relation to a high-voltage conductor 4 and is arranged inside an outer tube 1 of the high-voltage installation 2. Tube member 3 has a fastening shoulder 5 and a further fastening shoulder 6.

The tube member 3 includes a center tube part 3A and two outer tube parts 7 and 8 at respective ends of the center tube part 3A. Outer tube parts 7 and 8 form the guard ring electrodes. Consequently, they are mounted insulated from the center tube part 3A and/or its mounting shoulders 5 and 6 by providing connecting pieces 9 of insulating material between tube part 7 and the fastening shoulder 5. By means of screws 10, the fastening shoulder 5 is clamped in insulating relation to a fastening tab 11 and to a connecting piece 9. A spacing ring 12 made of insulating material and an insert ring 13 assure that screw 10 is insulated with respect to fastening tab 11. In a like manner, the further fastening shoulder 6 of tube member 3 is clamped by means of a further screw 14 to a supporting element 15 and a further fastening tab 16 at the other tube part 8. Here again, insulation between screw 14 and the further fastening tab 16 is assured by means of a further spacing ring 17 and a further insert ring 18. The fastening tabs 11 and 16 of tube pieces 7 and 8 are formed by the bent over ends of tube parts 7 and 8. Inside the space defined by the tube member 3 and the outer tube 1 of the high-voltage installation 2 are arranged transformer core units having respective iron cores 20 and 21 and respective secondary coil systems 22 and 23 mounted thereon. Between the cores 20 and 21 and on their side surfaces pressure pieces 24, 25 and 26 are mounted. When tightening thrust nuts 27 on threaded bolts 28 serving as a bracing device, the pressure piece 24 moves against fastening shoulder 5; whereas, threaded bolt 28 of thrust screw 27 pushes against the other fastening shoulder 6. Thereby the iron cores 20 and 21 carrying the secondary coil systems 22 and 23, respectively, are held tight to tube member 3. In the measuring transformer, according to the invention shown in the drawing, tube member 3 and the high-voltage conductor 4 define a high-potential capacitor of a capacitive voltage divider. The low-potential capacitor 29 of this divider is shown in schematic form on the drawing and can be mounted outside the outer tube 1. The low-potential capacitor 29 is connected with the tube member 3 to form the capacitive voltage divider; this connection is achieved with an insulated connecting wire 31 extending through opening 30 of the outer tube 1. The other connecting terminal of the low-potential capacitor is grounded. The low-potential capacitor 29 is connected to an amplifier 32 where at its output a voltage corresponding to the voltage on the high-voltage conductor 4 can be picked off.

Figure 2:
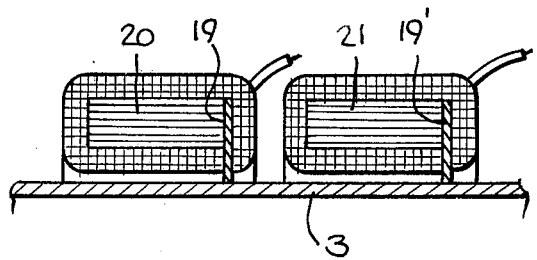
FIG. 2 is a schematic diagram showing how the transformer core units can be mounted to the tube member according to a subsidiary alternate embodiment of the invention.

FIG. 2 illustrates an alternate configuration for mounting the transformer core units on the outer surface of the tube member 3. Holding means in the form of holding elements 18 and 19 are provided for securing the transformer core units to the tube member 3. The holding elements 19 and 19' hold the transformer core units at iron cores 20 and 21 respectively. The tube member 3 and the holding elements 19 and 19' can be made of metal. The holding elements 18 and 19 are shown welded to the outer surface of the tube member 3.

The measuring transformer according to the invention is suitable for a completely insulated, metal-clad, high-voltage installation and can operate as a combined current and voltage transformer which can be produced at favorable cost.

What is claimed is:

1. A measuring transformer for a fully-insulated, metal-clad, high-voltage installation equipped with a metal outer tube containing a high-voltage conductor comprising: a tube member arranged within and spaced from the metal outer tube of the high-voltage installation and in surrounding relation to the high-voltage conductor, said tube member constituting a surface-type electrode and, said tube member and the high-voltage conductor conjointly defining a high-voltage capacitor; a low-voltage capacitor connected to said high-voltage capacitor so as to conjointly define therewith a capacitive voltage divider; a transformer core unit including an iron core, and a secondary winding system mounted on said iron core, said transformer core unit being arranged on the outer surface of said tube member whereby said tube member carries said transformer core unit inside the metal outer tube of the high-voltage installation; first mounting means at one location of said tube member for attaching the same to the metal outer tube so as to be insulated therefrom; and, second mounting means at another location of said tube member for supporting said tube member with respect to the metal outer tube so as to be insulated therefrom.

2. The measuring transformer of claim 1 comprising said first mounting means being at one end of said tube member for attaching the same to the metal outer tube so as to be insulated therefrom; and said second mounting means being at the other end of said tube member for supporting said tube member with respect to the metal outer tube so as to be insulated therefrom and so as to enable said tube member to expand freely within the outer metal tube in response to changes in temperature.

3. The measuring transformer of claim 2, said first mounting means comprising three connecting members made of insulating material disposed uniformly about the periphery of said tube member; and said second supporting means comprising three supporting elements made of insulating material likewise disposed uniformly about the periphery of said tube member.

4. A measuring transformer for a fully-insulated, metal-clad, high-voltage installation equipped with a metal outer tube containing a high-voltage conductor comprising: a tube member arranged within and spaced from the metal outer tube of the high-voltage installation and in surrounding relation to the high-voltage conductor, said tube member constituting a surface-type electrode and, said tube member and the high-voltage conductor conjointly defining a high-voltage capacitor; a low-voltage capacitor connected to said high-voltage capacitor so as to conjointly define therewith a capacitive voltage divider; a transformer core unit including an iron core, and a secondary winding system mounted on said iron core, said transformer core unit being arranged on the outer surface of said tube member whereby said tube member carries said transformer core unit inside the metal outer tube of the high-voltage installation; first mounting means at one end of said tube member for attaching the same to the metal outer tube so as to be insulated therefrom; and second mounting means at the other end of said tube member for supporting said tube member with respect to the metal outer tube so as to be insulated therefrom, said first mounting means comprising a fastening shoulder at said one end thereof, a fastening projection extending from the inner wall of the metal outer tube, a connecting member made of insulating material for connecting said fastening shoulder to said fastening projection, and first and second screw means for connecting said connecting member to said fastening shoulder and to said fastening projection respectively; and said second mounting means comprising a fastening shoulder extending from said tube member at said other end thereof, a supporting element for supporting said tube member with respect to the metal outer tube; and screw means for connecting said supporting element to said last-mentioned fastening shoulder.

5. The measuring transformer of claim 4, said first screw means of said first mounting means and said screw means of said second mounting means each including a screw having a shank of predetermined diameter; bore means formed in said fastening shoulder of said first mounting means for receiving therein the screw of said first screw means; bore means formed also in said fastening shoulder of said second mounting means for receiving therein the screw of said screw means of said second mounting means; each of said bore means having a bore diameter greater than said shank diameter whereby said tube member can be centered with respect to the high-voltage conductor; and holding means for holding said tube member in the centered position comprising first common bore means formed in said connecting member and said fastening shoulder of said first mounting means; second common bore means formed in said connecting member and said fastening projection; third common bore means formed in said supporting element and said fastening shoulder of said second mounting means; and dowel pins insertable in respective ones of said common bore means for holding said tube member in said centered position.

6. The measuring transformer of claim 4, said second screw means of said first mounting means and said screw means of said second mounting means each including a screw having a shank of predetermined diameter; bore means formed in said fastening projection of said first mounting means for receiving therein the screw of said second screw means; bore means formed also in said fastening shoulder of said second mounting means for receiving therein the screw of said screw means of said second mounting means; each of said bore means having a bore diameter greater than said shank diameter whereby said tube member can be centered with respect to the high-voltage conductor; and holding means for holding said tube member in the centered position comprising first common bore means formed in said connecting member and said fastening shoulder of said first mounting means; second common bore means formed in said connecting member and said fastening projection; third common bore means formed in said supporting element and said fastening shoulder of said second mounting means; and dowel pins insertable in respective ones of said common bore means for holding said tube member in said centered position.

7. The measuring transformer of claim 2 comprising two protective ring electrodes, each of said ring electrodes being configured as a tubular part, said tubular parts being mounted at respective longitudinal ends of said tube member so as to be electrically insulated therefrom.

8. A measuring transformer for a fully-insulated, metal-clad, high-voltage installation equipped with a metal outer tube containing a high-voltage conductor comprising: a tube member arranged within and spaced from the metal outer tube of the high-voltage installation and in surrounding relation to the high-voltage conductor, said tube member constituting a surface-type electrode and, said tube member and the high-voltage conductor conjointly defining a high-voltage capacitor; a low-voltage capacitor connected to said high-voltage capacitor so as to conjointly define therewith a capacitive voltage divider; a transformer core unit including an iron core, and a secondary winding system mounted on said iron core, said transformer core unit being arranged on the outer surface of said tube member whereby said tube member carries said transformer core unit inside the metal outer tube of the high-voltage installation; first mounting means at one end of said tube member for attaching the same to the metal outer tube so as to be insulated therefrom; second mounting means at the other end of said tube member for supporting said tube member with respect to the metal outer tube so as to be insulated therefrom, two protective ring electrodes, each of said ring electrodes being configured as a tubular part, said tubular parts being mounted at respective longitudinal ends of said tube member so as to be electrically insulated therefrom, one of said tubular parts being mounted on said tube member at one end thereof, and the other one of said tubular parts being mounted on said tube member at the other end thereof; said first mounting means comprising a fastening shoulder extending from said tube member on said one end thereof, a fastening tab extending from said one tubular part, and a fastening projection extending from the inner wall of the metal outer tube, a connecting member made of insulating material for connecting said fastening shoulder to said fastening projection, and insulating clamping means for clamping said fastening tab to said fastening shoulder and to said connecting member so as to insulate said shoulder from said tab, and means for connecting said connecting member to said fastening projection; and said second mounting means comprising a fastening shoulder extending from said tube member at said other end thereof, a fastening tab extending from said other one of said tubular parts, a supporting element for supporting said tube member with respect to the metal outer tube, and insulating clamping means for clamping said last-mentioned fastening tab to said last-mentioned fastening shoulder and to said supporting element so as to insulate said last-mentioned shoulder from said last-mentioned tab.

9. The measuring transformer of claim 8, said insulating clamping means of said first mounting means comprising a spacer member made of insulating material disposed between said fastening shoulder of said first mounting means and said fastening tab of said first mounting means, and screw means for clamping said last-mentioned fastening tab through said spacer member to said last-mentioned fastening shoulder and said connecting member; and said insulating clamping means of said second mounting means comprising a spacer member made of insulating material disposed between said fastening shoulder of said second mounting means and said fastening tab of said second mounting means, and screw means for clamping said fastening tab of said second mounting means through said last-mentioned spacer to said fastening shoulder of said second mounting means and to said supporting element.

10. The measuring transformer of claim 8 wherein said connecting member is disposed between said fastening shoulder of said first mounting means and said fastening tab of said first mounting means, said insulating clamping means of said first mounting means comprising screw means for clamping said last-mentioned fastening shoulder to said last-mentioned fastening tab, and annular spacer means for insulating said screw means from said fastening tab; and wherein said supporting element is disposed between said fastening shoulder of said second mounting means and said fastening tab of said second mounting means, said insulating clamping means of said second mounting means comprising screw means for clamping said last-mentioned fastening shoulder to said last-mentioned fastening tab, and annular spacer means for insulating said last-mentioned screw means from said last-mentioned fastening tab.

11. The measuring transformer of claim 8 wherein said connecting member is disposed between said fastening shoulder of said first mounting means and said fastening tab of said first mounting means, said insulating clamping means of said first mounting means comprising screw means for clamping said last-mentioned fastening shoulder to said last-mentioned fastening tab, and annular spacer means for insulating said screw means from said fastening shoulder; and wherein said supporting element is disposed between said fastening shoulder of said second mounting means and said fastening tab of said second mounting means, said insulating clamping means of said second mounting means comprising screw means for clamping said last-mentioned fastening shoulder to said last-mentioned fastening tab, and annular spacer means for insulating said last-mentioned screw means from said last-mentioned fastening shoulder.

12. The measuring transformer of claim 8, each of said tubular parts having a bent-over edge portion constituting the fastening tab thereof.

13. The measuring transformer of claim 1 comprising holding means for mounting said transformer core unit to said tube member.

14. The measuring transformer of claim 13, said holding means comprising a holding member for holding the iron core of said transformer core unit to said tube member.

15. The measuring transformer of claim 14, said holding member and said tube member both being made of metal, said holding member being welded to said tube member.

16. The measuring transformer of claim 2, said first mounting means comprising a fastening shoulder extending from said tube member at said one end thereof, said second mounting means comprising a fastening shoulder extending from said tube member at said other end thereof, said fastening shoulders being mutually adjacent; and, the transformer comprising a clamping device for clamping said iron core of said transformer core unit between said mutually adjacent fastening shoulders.

17. The measuring transformer of claim 16, said clamping device comprising a plurality of pressure screws.

* * * * *